United States Patent [19]
Alswede et al.

[11] Patent Number: 5,917,197
[45] Date of Patent: Jun. 29, 1999

[54] INTEGRATED MULTI-LAYER TEST PADS

[75] Inventors: Frank Alswede, Wappingers Falls; William Davies, Pleasant Valley; Ronald Hoyer, Poughkeepsie, all of N.Y.; Ron Mendelson, Richmond, Vt.; Frank Prein, Wappingers Falls, N.Y.

[73] Assignees: Siemens Aktiengesellschaft, Munich, Germany; International Business Machines Corporation, Armonk, N.Y.

[21] Appl. No.: 08/861,465

[22] Filed: May 21, 1997

[51] Int. Cl.⁶ .................................................. H01L 23/58
[52] U.S. Cl. .......................... 257/48; 257/203; 257/211; 257/758; 257/923; 324/757; 324/765; 324/766; 324/767; 324/768; 324/769
[58] Field of Search .............................. 257/48, 758, 211, 257/203, 923; 324/765, 757, 766, 767, 768, 769

[56] References Cited

U.S. PATENT DOCUMENTS

| | | | |
|---|---|---|---|
| 5,383,093 | 1/1995 | Nagaska | 361/771 |
| 5,554,940 | 9/1996 | Hubacher | 324/765 |
| 5,686,759 | 11/1997 | Hyde et al. | 257/730 |
| 5,726,458 | 3/1998 | Bui | 257/48 |
| 5,734,187 | 3/1998 | Bohr et al. | 257/377 |
| 5,760,429 | 6/1998 | Yano et al. | 257/211 |
| 5,760,477 | 6/1998 | Cronin | 257/767 |

*Primary Examiner*—William Mintel
*Attorney, Agent, or Firm*—Stanton C. Braden

[57] ABSTRACT

A multi-layer test pad on a semiconductor wafer, which includes an underlying matrix of interconnected first pads, which are arranged in rows and columns. The multi-layer test pad includes an oxide layer disposed above the underlying matrix and in between the rows and columns. The multi-layer test pad further includes an overlying matrix of interconnected second pads disposed above the oxide layer. Each of the second pads completely overlaps at least nine of the first pads, including four oxide regions surrounding a center first pad of the nine of the first pads. The nine of the first pads are arranged as 3×3 block of the first pads.

14 Claims, 4 Drawing Sheets

INTEGRATED MULTI-LAYER TEST PADS

BACKGROUND OF THE INVENTION

The present invention relates to the manufacture of integrated circuits (ICs). More particularly, the present invention relates to improved designs for integrated test pads that advantageously improve structural integrity and substantially minimize the level of particulate contamination during IC manufacturing.

In the fabrication of semiconductor integrated circuits, devices such as component transistors, resistors, capacitors, and the like are typically formed on a substrate, e.g., a silicon wafer. The substrate typically includes a plurality of layers, out of which semiconductor device components are formed, e.g., via etching, doping, or the like. After the desired circuits are formed on the wafer, the wafer may then be diced into a plurality of dies. The dies may then be packaged into the finished IC products.

To monitor the performance of the manufacturing process and/or test the quality of the semiconductor devices formed on the substrate, integrated conductive test pads, which may be formed by conventional semiconductor manufacturing processes (e.g., deposition and etching) may be provided on the substrate. The integrated test pads provide electrical paths to selected devices, thereby allowing their electrical parameters to be measured from externally, e.g., via test probes. By comparing the measured parameters against the designed parameters, the performance of the semiconductor manufacturing process(es) may be ascertained.

To facilitate discussion, FIG. 1 is a cross-sectional view of a greatly simplified layer stack 100, including an integrated resistor 102 which may be formed out of, for example, layer 104. Above layer 104, there is disposed a dielectric layer 110, which mechanically supports and electrically insulates test pads 106 and 108 from one another. To provide an electrical path between test pad 106 and integrated resistor 102, a conducting via 112 is employed to couple test pad 106 to one end of integrated resistor 102. Likewise, test pad 108 is coupled to the other end of integrated resistor 102 by a conducting via 114. In the example of FIG. 1, test pads 106 and 108 may be employed during quality control to, for example, test the resistivity of integrated resistor 102. The measured resistivity may be compared against the designed resistivity value to determine whether the process(es) employed to fabricate integrated resistor 102 performed as intended.

Layer stack 100, as mentioned, is greatly simplified to facilitate ease of understanding. In many cases, the test pads are not located directly above the device to be measured, e.g., resistor 102 in the above example. To maximize use of the available wafer area, the test pads may be located in the kerf regions of the wafer, i.e., the regions between adjacent dies. Multiple metallization layers may then be employed to facilitate the conduction of electrical signals from the interior region of the die to the kerf region, where the test pads are located. The top surface of a test pad is typically dimensioned such that the test pad can accommodate a probe contacting the test pad from above. If a 25 micron probe tip is employed, the top surface of test pad 106 may measure 100 microns by 100 microns, for example.

If test pads 106 and 108 were solid metal plates or solid metal plugs, the mechanical strength of the test pads is relatively high. However, the use of solid metal test pads may cause difficulties to the dicing operation that is employed to cut the wafer into dies after semiconductor processing is completed. As is known by those skilled in the art, it is preferable during dicing to minimize as much as possible any contact between the dicing blade and metal. Too much metal-to-blade contact can shorten the life of the dicing blade, necessitating frequent and expensive replacements. This is particularly true if test pads 106 and 108 are formed of a hard metal such as tungsten.

To minimize the amount of metal contact between the dicing blade and the test pads, there is proposed in the prior art a test pad design which consists of a plurality of substantially identically sized matrices of interconnected pads. These substantially identically sized matrices of interconnected pads are disposed atop one another, albeit separated from one another by a layer of dielectric material. To facilitate discussion, FIG. 2 illustrates a top view of matrix 202, representing a portion of a simplified prior art test pad in which pads 204 are interconnected by a plurality of pad connectors 206. Pads 204 and pad connectors 206 are typically formed out of a single layer of metal, e.g., etched out of a blanket deposited metal layer such as an aluminum layer. Tungsten is sometimes employed as well. Pad 204 may measure, in a prior art example, about 2.4 microns by 2.4 microns. Pad connector 206 may measure, in a prior art example, about 2.4 microns by 0.9 micron.

A subsequently deposited oxide layer, in addition to providing a dielectric insulating layer above matrix 202, fills in the interstitial spaces between the pads. Compared to a solid metal plate of a similar size, the matrix structure of matrix 202 has less metal within the test pad, thereby reducing the amount of metal-to-blade contact should the dicing blade need to slice through matrix 202 when the wafer is cut up into dies.

When multiple matrices are involved, the prior art approach has been to provide substantially similar matrices 102 in the multiple metal levels, and to interconnect the matrices together using conductive vias through the dielectric interlayers. FIG. 3 is a cross sectional view of a prior art test pad 302 in which multiple identical matrices 202 are essentially stack on top of one another, albeit separated from one another by a dielectric layer 304. A plurality of conductive vias 306 are shown coupling matrix 202a with matrices 202b and 202c through dielectric layers 304a and 304b. One skilled in the art would readily recognize that prior art test pad 302 employs less metal in its construction than one that is solid. As mentioned earlier, the reduced amount of metal within the test pad minimizes the amount of metal-to-blade contact when the wafer is diced.

When prior art test pad 302 of FIG. 3 is employed in the manufacture of certain circuits, e.g., Dynamic Random Access Memory (DRAM), it has been found to be deficient in certain areas. For example, DRAM manufacturing often employs a TV etch, followed by a crack stop etch (CSE). TV etch consists of a blanket RIE (reactive ion etching) removal of oxide that is not masked by a metal or polyimide layer. Crack stop etch (CSE) consists of an etch of the exposed metal (e.g., a peroxide or $H_2O_2$ etch of tungsten).

With reference to FIG. 2, the TV etch attacks the open oxide areas adjacent to a pad, e.g., open areas 208 a–d surrounding pad 204a. The TV etch, which is a dry etch, typically forms fairly isotropic etch features. Accordingly, some of the edges of pad 204a, as well as the pad connectors 206 that are adjacent to it, may be exposed after the TV etch. If the TV etch is of a sufficiently long duration, it may be deep enough to even expose the edges of the pads and pad connectors in the matrix at the lowest level of the test pad. Typically, this bottom matrix layer is formed of tungsten. The subsequent crack stop etch then attacks the pads and pad connectors, which have been stripped off their protective oxide covering by the earlier TV etch.

The inadvertent etching of the underlying tungsten pads may lead to many problems. If enough of the underlying tungsten is attacked, test pad 302 may become unstable and/or poorly supported mechanically. For example, some of pads 204 in the upper level matrices may be delaminated and become particulate contaminants, which may contaminate the wafer during subsequent processing steps and lead to reliability problems. Further, the removal of oxide undermines the structural integrity of test pad 302, causing some prior art test pad 302 to collapse when the test probe is applied to its top surface. Additionally, the lack of structural integrity and/or delamination may cause some of pads 204 of the prior art test pad to disintegrate, either on their own or when coming into contact with the dicing blade, thereby increasing the level of contaminants on the substrate, leading to even more severe quality control problems.

In view of the foregoing, there are desired improved test pad designs, and methods therefor, which advantageously increase the integrity of the test pads as well as minimize contamination to the substrate even after the test pads are subject to the TV and/or crack stop etches.

SUMMARY OF THE INVENTION

The invention relates, in one embodiment, to a multi-layer test pad on a semiconductor wafer. The multi-layer test pad is configured for electrically coupling with an integrated semiconductor device formed out of the semiconductor wafer. The multi-layer test pad includes an underlying matrix of interconnected first pads. The first pads are configured for electrically coupling with the integrated semiconductor device. The multi-layer test pad further includes an oxide layer disposed above the underlying matrix. There is further included an overlying matrix of interconnected second pads disposed above the oxide layer. One of the first pads has a first surface area smaller than a second surface area of one of the second pads and is disposed below and being completely overlapped by the one of the second pads. The multi-layer test pad also includes at least one conductive via electrically coupling the underlying matrix with the overlying matrix through the oxide layer.

In another embodiment, the invention relates to a method for forming an integrated multi-layer test pad on a semiconductor wafer. The method includes forming an underlying matrix of interconnected first pads. The first pads are configured for electrically coupling to the integrated semiconductor device. The method includes depositing an oxide layer above the underlying matrix and forming an overlying matrix of interconnected second pads above the oxide layer. The overlying matrix is electrically coupled to the underlying matrix by at least one conductive via through the oxide layer. One of the first pads has a first surface area smaller than a second surface area of one of the second pads. The second pad is disposed above and completely overlapping the one of the first pads, whereby the one of the second pads masks an area under the one of the second pads, including the one of the first pads, from being etched by an oxide etchant.

In yet another embodiment, the invention relates to a multi-layer test pad on a semiconductor wafer, which includes an underlying matrix of interconnected first pads, which are arranged in rows and columns. The multi-layer test pad includes an oxide layer disposed above the underlying matrix and in between the rows and columns. The multi-layer test pad further includes an overlying matrix of interconnected second pads disposed above the oxide layer. Each of the second pads completely overlaps at least nine of the first pads, including four oxide regions surrounding a center first pad of the nine of the first pads. The nine of the first pads are arranged as 3×3 block of the first pads.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention will now be described in detail with reference to the following embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 3:
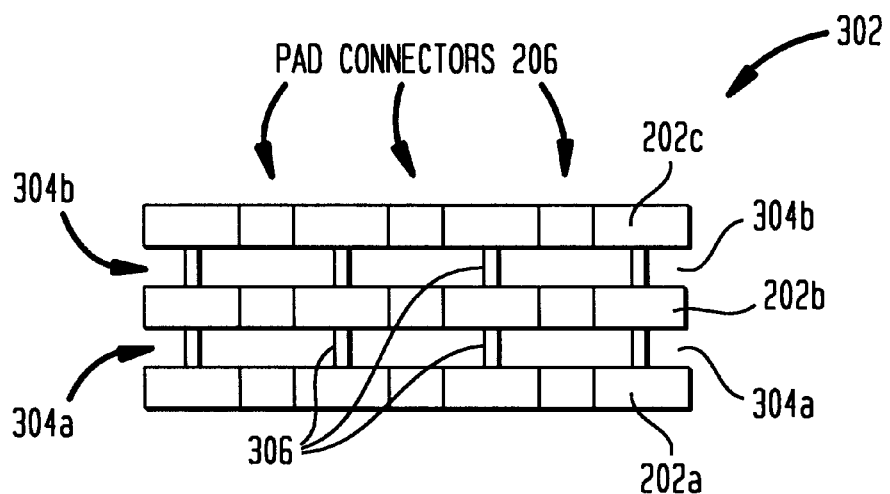
FIG. 3 illustrates a cross-sectional view of prior art test pad.

In accordance with one aspect of the present invention, there is provided a multi-layer test pad structure which advantageously minimizes the etching of the underlying tungsten matrix, e.g., matrix 202a of FIG. 3 during the crack stop etch (CSE). In accordance with one embodiment, the matrix format is still employed to retain the advantages associated with reduced metal-to-blade contact when the wafer is cut by the dice blade. However, noting that the TV etch is essentially a dry and substantially isotropic etch, which may be masked by either polyamite or aluminum, the invention employs aluminum in the top matrix (e.g., matrix 202c of FIG. 3) in order to take advantage of the masking property of aluminum.

Unlike the prior art, however, the aluminum pads in the top matrix is, in a unobvious and counterintuitive manner, substantially enlarged relative to pads in the lower matrices of the multi-layer test pad. Enlargement is nonobvious since it is counter to the logic that dictates the use of a matrix structure in the first place, i.e., to reduce the amount of metal in the test pad structure to minimize metal-to-blade contact.

In one embodiment, the size of the top aluminum pad is dimensioned such that there will be some oxide protecting the underlying tungsten pads of the underlying matrices (and edges thereof) during the crack stop etch (CSE), taking into account any possible horizontal penetration of the wet CSE etchant. Since the underlying tungsten pads and pad connectors (or edges thereof) are not exposed to the CSE etch, more tungsten remains to anchor the multi-layer test pad structure to the substrate afterwards. Advantageously, delamination is substantially minimized.

The enlarged top pad/mask also acts, during the TV etch, to protect the oxide pockets that are disposed directly under the enlarged top pad/mask. Accordingly, oxide areas that are in between the pads and that are under the enlarged top pad/mask do not get hollowed out after the TV etch. This is unlike the prior art situation wherein substantially every oxide area between adjacent pads is not protected during the TV etch and is hollowed out by the TV etchant.

Because a greater oxide bulk remains after the TV etch, the invention yields a mechanically stronger multi-layer test pad, which more effectively supports the force exerted thereon by external probes. The improved structural integrity of the resulting multi-layer test pad also permits the use of automated probes, which were found to have imposed, in many cases, too strong a force for prior art test pads to withstand. As can be appreciated by those skilled in the art, the ability to employ automated test equipments vastly improves the efficiency, quality, and speed of the testing process.

Figure 4:
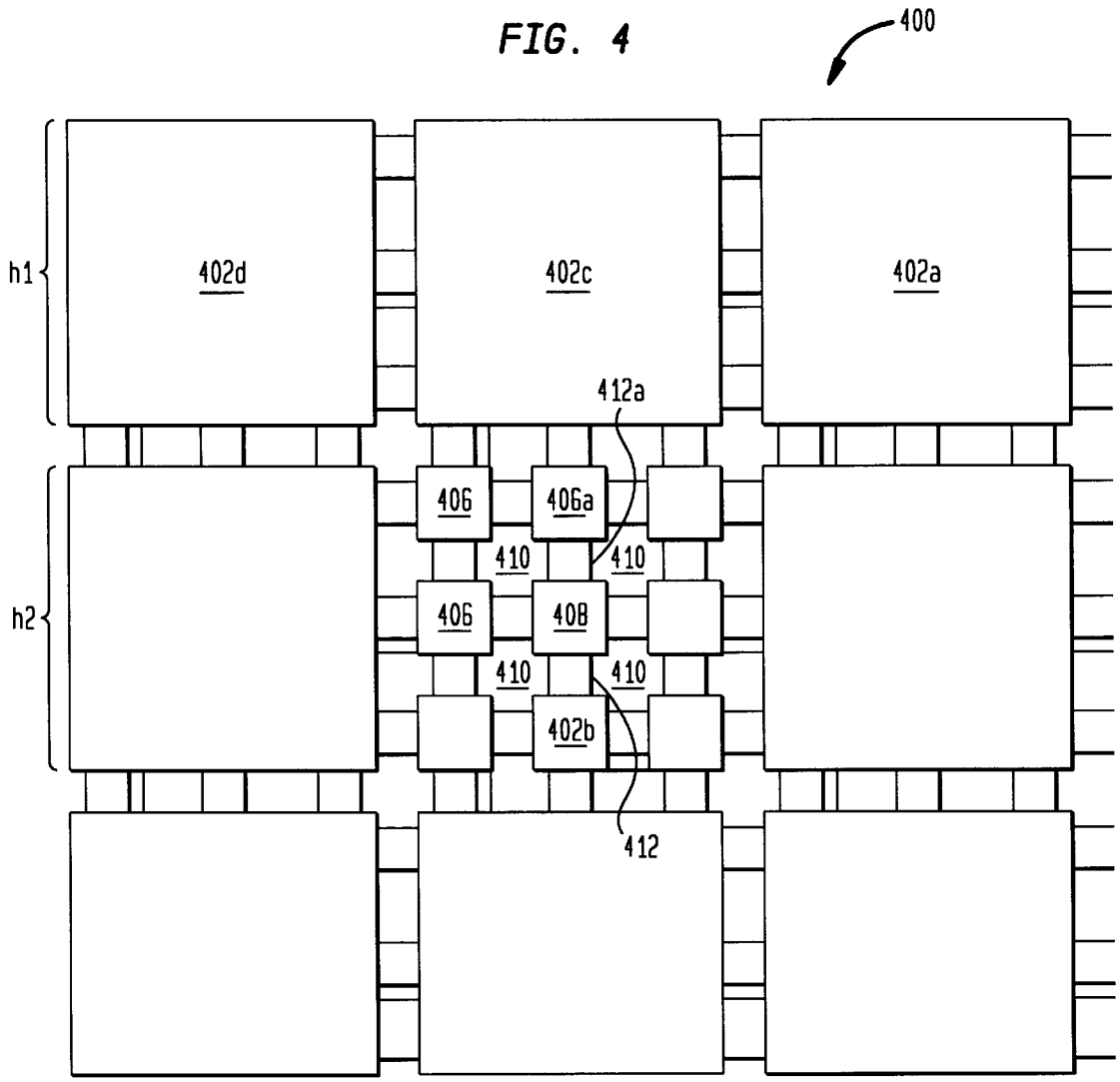
FIG. 4 illustrates, in accordance with one embodiment of the present invention, a portion of the inventive multi-layer test pad, including a plurality of top matrix pads/masks.

To facilitate discussion of the foregoing, FIG. 4 illustrates, in accordance with one embodiment of the present invention, a portion of the inventive multi-layer test pad 400 including a plurality of top matrix pads/masks 402. An exemplary top matrix pad/mask is referenced in FIG. 4 by item 402a. As mentioned earlier, the top matrix is preferably formed of aluminum in order to mask the underlying areas from the TV etchant. However, the top matrix may also be formed of any other suitably conductive masking material having the required masking properties.

For ease of visualization, top matrix pad/mask 402b has been removed to expose the interconnected tungsten pads that underlie the removed top matrix pad/mask 402b. As can be seen in FIG. 4, the bottom tungsten matrix includes a plurality of tungsten pads arranged in a matrix pattern and are interconnected. Accordingly, when any of the underlying tungsten pads is connected to a terminal of the device to be tested, the same signal appears throughout the underlying matrix of tungsten pads. A plurality of conductive vias coupling to both the top matrix and the underlying tungsten matrix (possibly involving other metallization layers in between) transmit the same signal to the top matrix, and the signal may be obtained by reading any of the top matrix pads/masks 402.

Further note that top matrix pad/mask 402b is substantially larger relative to the underlying pads overlapped by it. The size of top matrix pad/mask 402b may be determined, in one embodiment of the invention, by the minimum amount of tungsten that should remain after the TV/CSE etch sequence to guarantee an acceptably robust test pad and an acceptably low level of probe pad-induced contamination. If the CSE etch is found to have a fairly low level of horizontal penetration along the tungsten pads (starting from the edges along the feature walls that are exposed to the CSE etchant by the earlier TV etch), a smaller top matrix pad/mask may be adequate. If the horizontal penetration is fairly aggressive, or if a particularly strong test pad is desired, the size of the top matrix pad/mask may be enlarged to increase the amount of protective and mechanically supportive oxide remaining under the top matrix pad/mask after the TV etch.

In one embodiment, the area that is overlapped by the top matrix pad/mask represents an area bound by a 3×3 block of underlying pads. With reference to top matrix pad/mask 402b, for example, this area includes 8 periphery underlying pads 406 and a center underlying pad 408. Notice the presence of oxide areas 410, of which there are four, which are completely overlapped by top matrix pad/mask 402b. These oxide areas are shown adjacent to center pad 408.

During the TV etch, these oxide areas 410 are advantageously shielded or masked from the TV etchant by the overlying top matrix pad/mask 402b. As mentioned earlier, the dry TV etch is typically a substantially isotropic etch (i.e., the walls of the etched features are substantially vertical). Advantageously, oxide areas 410 remain unetched after the TV etch to provide structural integrity for the portion of multi-layer probe 400 that is overlapped by top matrix pad/mask 402b.

Further, during the subsequent crack stop etch (CSE), the presence of oxide areas 410 advantageously shields center pad 408 and its four adjacent pad connectors 412 from the CSE etchant. Peripheral pad 406 may undergo some etching due to the horizontal penetration of the CSE etchant. However, the size of each of the top matrix pad/mask 402 and/or underlying pads may be dimensioned such that the horizontal penetration along the underlying tungsten pads and/or pad connectors do not etch away more tungsten than is acceptable for structural integrity. If desired, the size of top matrix pad/mask 402b may overlap a slighly larger area than the illustrated 3×3 block of underlying tungsten pads to ensure that some oxide is present between the edges of the underlying tungsten pads and the CSE etchant during the subsequent CSE etch to minimize tungsten loss. In one example, the size of top matrix pad/mask 402b measures 9.6 microns by 9.6 microns while the underlying tungsten pads measure 1.2 microns by 1.2 microns each.

In the example of FIG. 4, if the CSE etchant is fairly aggressive, underlying tungsten pad 406a may be etched away by the CSE etchant creeping in from the gap between the top matrix pads/masks 402b and 402c (the oxide therein, not being protected by an overlying aluminum layer, had been etched away in the earlier TV etch). If the CSE etchant is particularly aggressive, some or all of the underlying tungsten pad connector 412a between pad 406a and center pad 408 may even be etched away. However, it is preferable that at least a sufficient amount of tungsten remains in center pad 408 to anchor top matrix pad/mask 402b and the multi-layer test pad 400 to the substrate after the TV/CSE etch sequence. Of course, more tungsten may remain by either increasing the size of the top matrix pad/mask 402b or by adjusting the CSE recipe to obtain a more isotropic etch (i.e., less horizontal penetration by CSE etchant).

Figure 2:
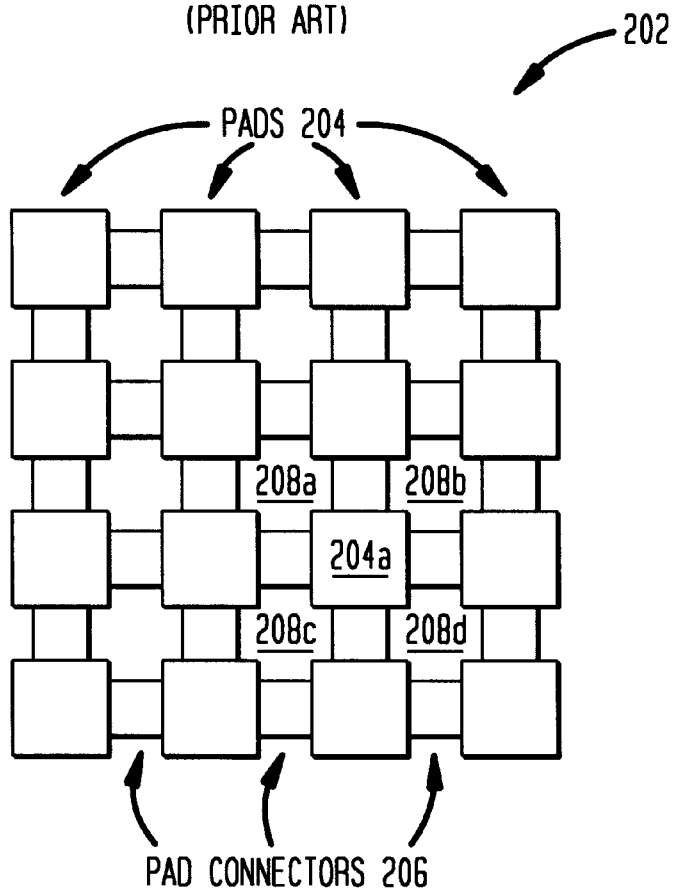
FIG. 2 illustrates a top view of prior art test pad.

Irrespective of the amount of tungsten remaining, it should be recognized that there is more oxide bulk (due to the enlarged masking top matrix pad/mask) in the multi-layer test pad of the present invention compared to the amount of oxide remaining in the prior art test pad of FIGS. 2 and 3. The presence of this oxide, e.g., in oxide areas 410 after TV etching, allows the inventive multi-layer test pad to withstand a greater probe force, rendering it capable of handling automated probes and reducing the possibility of test pad shattering and its concomitant contamination consequences.

Further, it is not necessary that the size of the top matrix pads/masks remain the same throughout a single multi-layer test pad. By way of example, a phenomenon known as reverse microloading may cause the oxide to be etched faster in the narrow regions, e.g., between top matrix pad/masks 402, than in the open field regions (e.g., in the oxide areas surrounding multi-layer test pad 400). In these cases, it may be desirable to dimension the top matrix pads/masks accordingly such that those surrounding the periphery of multi-layer test pad 400 are slightly larger than those in the center region of multi-layer test pad 400.

For example, the height $h_1$ of top matrix pad/mask 402c may be made slightly larger than the height $h_2$ of top matrix pad/mask 402b, in order to take into account the increase in horizontal penetration into the oxide by the TV etch from the open field region. The increase in height depends, in part, on the horizontal penetration (downward when viewed in FIG. 4) into the oxide that occurs in the TV etch. By properly dimensioning the periphery pads/mask 402c of the multi-layer test pad, it is possible to ensure that an acceptable amount of oxide (after the TV etch) and tungsten (after the CSE etch) would remain under each top matrix pad/mask 402 irrespective of the presence of reverse microloading in the TV etch process. In one example, the size of each top matrix pad/mask in the periphery of multi-layer test pad 400 measures 9.6 microns by 10.1 microns, with the longer side being perpendicular to the edge of the multi-layer test pad at which that top matrix pad/mask is disposed.

For the four top matrix pad/masks disposed at the four corners of the multi-layer test pad 400, two of the edges of each top matrix pad/mask will be exposed to the open-field region and may therefor be subject to a greater degree of horizontal penetration into the oxide during the TV etch (assuming reverse microloading is present). Accordingly, it may be desirable to increase the dimension of both of these edges to take into account the greater amount of horizontal penetration into the oxide (during the TV etch). In one example, the size of each top matrix pad/mask in the corner of multi-layer test pad 400 measures 10.1 microns by 10.1 microns.

Of course, if the TV etch recipe results in natural microloading (i.e., the vertical etch rate through the oxide is faster in the open-field regions relative to that in the narrow regions), the center top matrix pad/mask 402 of multi-layer test pad 400 may be made slightly larger along with widths and heights to take into account the greater amount of horizontal penetration into the oxide of the TV etchant (since slower vertical etching typically means greater horizontal penetration). The four corner top matrix pads/masks may have smaller widths and heights while other periphery top matrix pads/masks may be reduced in either their widths or heights (depending on where they are located along the periphery of multi-layer test pad 400).

Figure 5:
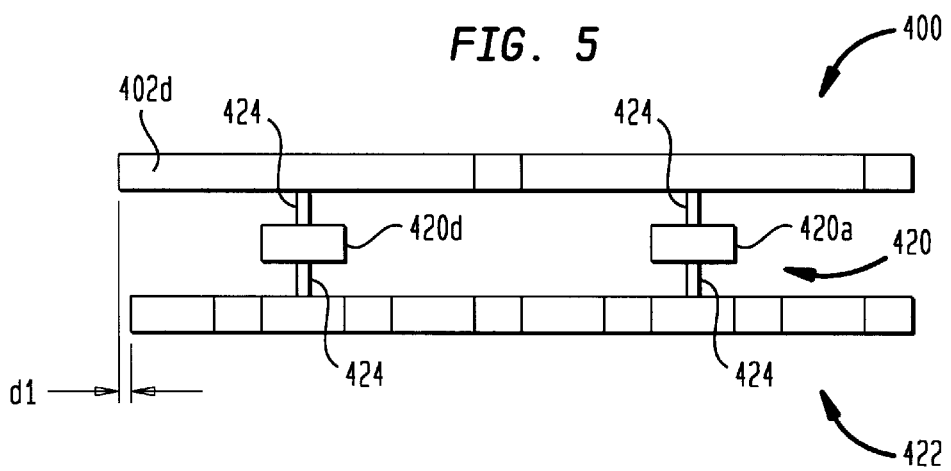
FIG. 5 is a cross-sectional view of the multi-layer test pad of FIG. 4.

FIG. 5 is a cross-sectional view of the multi-layer test pad 400 of FIG. 4, including an intermediate conductive layer 420. The dimensions of the interconnected pads of intermediate conductive layer 420 (e.g., pads 420a, and 420b) are determined based on, in part, the design rules and considerations regarding via placements. For the purpose of the present invention, it is preferable that the dimension of the interconnected pads of intermediate metal layer 420 be minimized to further reduce the metal-to-blade contact. Although only one intermediate conductive layer 420 is shown, multiple intermediate conductive layers may be employed as desired.

In FIG. 5, top matrix pad/mask 402d corresponds to the corner top matrix pad/mask 402d of FIG. 4. The greater width of this corner pad/mask, relative to the area occupied by the 3×3 block of underlying tungsten pads, is shown clearly by the fact that it extends further from the edge of the tungsten layer 422 by a distance d1. This distance d1 represents the increase discussed earlier to take into account the greater amount of horizontal penetration by the TV etchant into the oxide from the open field region surrounding the multi-layer test pad 400. For completeness, the conductive vias 424 electrically interconnecting the matrices together are also shown in FIG. 5.

Figure 6:
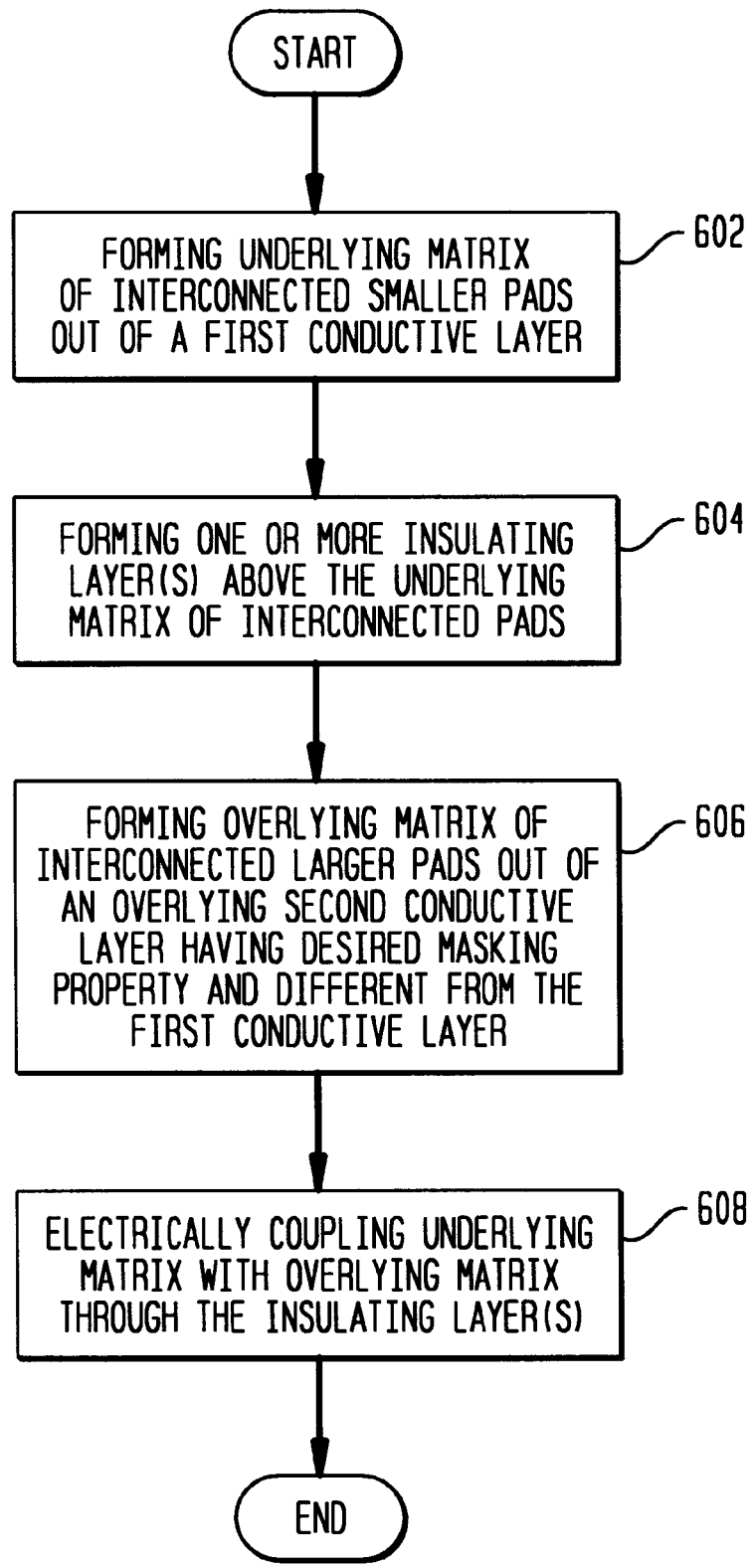
FIG. 6 illustrates, in accordance with one aspect of the present invention, the steps involved in forming the inventive multi-layer test pad.

FIG. 6 illustrates, in accordance with one aspect of the present invention, the steps involved in forming the inventive multi-layer test pad and/or improving test pad structural integrity and/or reducing test pad-induced contamination. In step 602, the underlying matrix of smaller pads are formed from a first conductive layer. In one embodiment, this underlying matrix represents the bottom-most matrix of the multi-layer test pad. This underlying matrix may be made of, for example, tungsten. In step 604, one or more insulating layers may be deposited. It should be understood that if more than one insulating layer is involved, one or more intermediate conductive layer(s) (e.g., intermediate metal layer 420 of FIG. 5) may be provided to facilitate electrical interconnection between the matrices.

In step 606, the overlying matrix of larger pads are formed from another conductive layer that has the desired masking property. In one embodiment, this overlying matrix is formed of aluminum to mask the oxide underneath from the TV etchant. Preferably, this overlying matrix represents the upper-most matrix of the multi-layer test pad structure. The relative dimensions between the overlying pad and the underlying pad depend, as mentioned, on the aggressiveness of the subsequent etchant (e.g., the CSE etchant) in penetrating horizontally along the edge of the exposed tungsten pads. The relative dimensions also depend, as discussed, on how much remaining oxide is desired under the top matrix pad/mask and whether microloading is involved. In general, larger top matrix pads/masks tend to produce a stronger multi-layer test pad and increase the amount of remaining tungsten to better anchor the resulting multi-layer test pad to the substrate underneath. The top matrix pads/masks should not be so large, however, as to result in undue metal-to-blade contact during wafer cutting, which disadvantageously shortens the dice blade as mentioned earlier.

Figure 1:
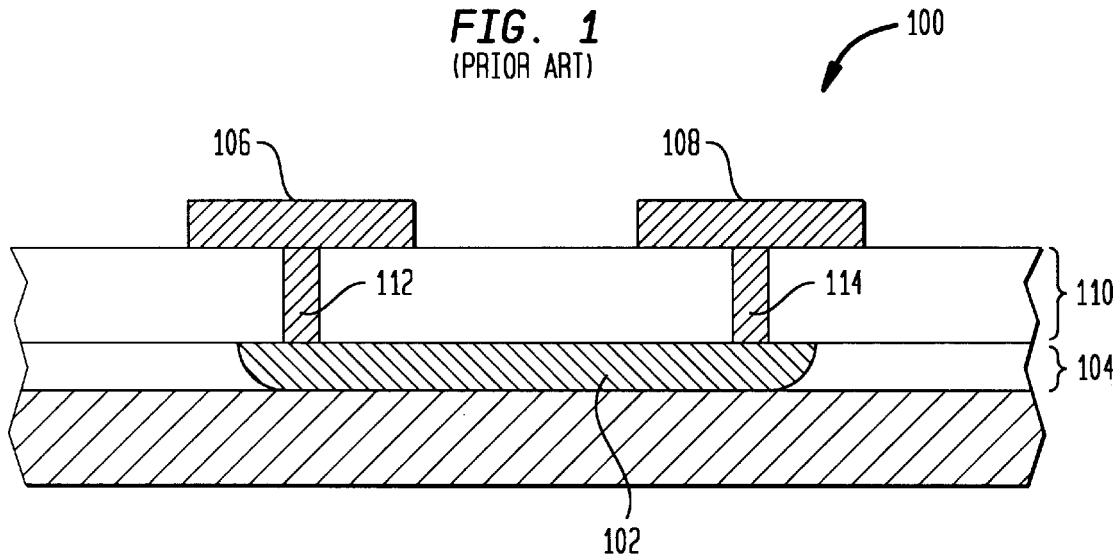
FIG. 1 is a cross-sectional view of a greatly simplified layer stack, including a prior art test pad disposed thereon.

In step 608, the overlying matrix is electrically coupled to the underlying matrix through, e.g., conductive vias. Note that this step 608 may be inherently performed as the overlying conductive layer is deposited over the insulating oxide layer and into holes formed therein. The resulting multi-layer test pad may then be employed to test electrical parameters of devices coupled to its underlying matrix to ascertain information pertaining to process performance (as discussed earlier in connection with FIG. 1).

While this invention has been described in terms of several preferred embodiments, there are alterations, permutations, and equivalents which fall within the scope of this invention. It should be noted that although the bottom matrix is described as the matrix affected by the subsequent CSE etch, the inventive structure may be employed to protect any underlying matrix (whether or not the bottom most matrix of the multi-layer test pad) from being etched by the subsequent CSE etch. Although the first etch that affects the oxide is described herein as a TV etch, it may in fact represent any oxide etch step. Further, although tungsten and CSE etch are employed herein to facilitate ease of understanding and consistency of illustration, the inventive structure applies to protect any underlying matrix from the etchant of a subsequent etch by employing the enlarged top matrix pad/mask to increase oxide protection in the earlier etch. It is therefore intended that the following appended claims be interpreted as including all such alterations, permutations, and equivalents as fall within the true spirit and scope of the present invention.

What is claimed is:

1. On a semiconductor wafer, a multi-layer test pad configured for electrically coupling with an integrated semiconductor device formed out of said semiconductor wafer, comprising:

an underlying matrix of interconnected first pads, said first pads being configured for electrically coupling with said integrated semiconductor device;

an oxide layer disposed above said underlying matrix;

an overlying matrix of interconnected second pads disposed above said oxide layer, one of said first pads having a first surface area smaller than a second surface area of one of said second pads, said one of said first pads being disposed below and being completely overlapped by said one of said second pads; and at least one conductive via electrically coupling said underlying matrix with said overlying matrix through said oxide layer.

2. The multi-layer test pad of claim 1 wherein said overlying matrix of interconnected second pads comprises aluminum.

3. The multi-layer test pad of claim 2 wherein said underlying matrix of interconnected first pads comprises tungsten.

4. The multi-layer test pad of claim 1 wherein said overlying matrix of interconnected second pads comprises a plurality of periphery second pads and at least one center second pad, a surface area of said center second pad being at least larger than an area occupied by a 3×3 block of said first pads, said 3×3 block of said first pads being disposed below said center second pad.

5. The multi-layer test pad of claim 4 wherein each of said periphery second pads is larger in surface area than said center second pad.

6. The multi-layer test pad of claim 5 further comprising four corner second pads disposed at four corners said multi-layer test pad, each of said four corner second pads being larger than said each of said periphery second pads.

7. The multi-layer test pad of claim 1 wherein said overlying matrix of interconnected second pads comprises a plurality of periphery second pads and at least one center second pad, a surface area of said center second pad being substantially equal to an area occupied by a 3×3 block of said first pads, said 3×3 block of said first pads being disposed below said center second pad.

8. The multi-layer test pad of claim 1 further comprising an intermediate metallization layer, said intermediate metallization layer being coupled to both said overlying matrix and said underlying matrix.

9. On a semiconductor wafer, a multi-layer test pad, comprising:

an underlying matrix of interconnected first pads, said first pads being arranged in rows and columns;

an oxide layer disposed above said underlying matrix and in between said rows and columns; and an overlying matrix of interconnected second pads disposed above said oxide layer, each of said second pads completely overlaps at least nine of said first pads, including four oxide regions surrounding a center first pad of said nine of said first pads, said nine of said first pads being arranged as 3×3 block of said first pads.

10. The multi-layer test pad of claim 9 wherein said overlying matrix of interconnected second pads comprises aluminum.

11. The multi-layer test pad of claim 10 wherein said underlying matrix of interconnected first pads comprises tungsten.

12. The multi-layer test pad of claim 9 wherein said overlying matrix of interconnected second pads comprises a plurality of periphery second pads and at least one center second pad, said periphery second pads surrounding a periphery of said multi-layer test pad, each of said periphery second pads being at least larger than an area occupied by said 3×3 block of said first pads.

13. The multi-layer test pad of claim 12 further comprising four corner second pads disposed at four corners of said multi-layer test pad, each of said four corner pads being larger than said each of said periphery second pads.

14. The multi-layer test pad of claim 9 further comprising an intermediate metallization layer, said intermediate metallization layer being coupled to both said overlying matrix and said underlying matrix.

* * * * *